(12) United States Patent
Porter et al.

(10) Patent No.: US 7,864,609 B2
(45) Date of Patent: Jan. 4, 2011

(54) METHODS FOR DETERMINING RESISTANCE OF PHASE CHANGE MEMORY ELEMENTS

(75) Inventors: John D. Porter, Meridian, ID (US); Jennifer Taylor, Boise, ID (US)

(73) Assignee: Micron Technology, Inc., Boise, ID (US)

(*) Notice: Subject to any disclaimer, the term of this patent is extended or adjusted under 35 U.S.C. 154(b) by 170 days.

(21) Appl. No.: 12/165,273

(22) Filed: Jun. 30, 2008

(65) Prior Publication Data

US 2009/0323408 A1    Dec. 31, 2009

(51) Int. Cl.
*G11C 7/02* (2006.01)
(52) U.S. Cl. .................. 365/207; 365/189.15
(58) Field of Classification Search .......... 365/207, 365/189.15, 163, 148; 341/161
See application file for complete search history.

(56) References Cited

U.S. PATENT DOCUMENTS

| | | | |
|---|---|---|---|
| 5,600,319 A | 2/1997 | Ginetti | |
| 5,614,856 A | 3/1997 | Wilson et al. | |
| 5,953,276 A | 9/1999 | Baker | |
| 6,044,019 A | 3/2000 | Cernea et al. | |
| 6,188,340 B1 | 2/2001 | Matsumoto et al. | |
| 6,282,120 B1 | 8/2001 | Cernea et al. | |
| 6,490,200 B2 | 12/2002 | Cernea et al. | |
| 6,504,750 B1 | 1/2003 | Baker | |
| 6,567,297 B2 | 5/2003 | Baker | |
| 6,661,708 B2 | 12/2003 | Cernea et al. | |
| 6,664,708 B2 | 12/2003 | Shlimak et al. | |
| 6,741,502 B1 | 5/2004 | Cernea | |
| 6,781,906 B2 | 8/2004 | Perner et al. | |
| 6,785,156 B2 | 8/2004 | Baker | |
| 6,795,359 B1 | 9/2004 | Baker | |
| 6,798,705 B2 | 9/2004 | Baker | |
| 6,813,208 B2 | 11/2004 | Baker | |
| 6,822,892 B2 | 11/2004 | Baker | |
| 6,826,102 B2 | 11/2004 | Baker | |
| 6,829,188 B2 | 12/2004 | Baker | |
| 6,847,234 B2 | 1/2005 | Choi | |
| 6,850,441 B2 | 2/2005 | Mokhlesi et al. | |
| 6,856,564 B2 | 2/2005 | Baker | |
| 6,870,784 B2 | 3/2005 | Baker | |
| 6,901,020 B2 | 5/2005 | Baker | |
| 6,914,838 B2 | 7/2005 | Baker | |
| 6,930,942 B2 | 8/2005 | Baker | |

(Continued)

OTHER PUBLICATIONS

Baker, "*CMOS Circuit Design, Layout, and Simulation*," Second Edition, IEEE Press, A. John Wiley & Sons, Inc.; Copyright 2005; Chapters 13, 16, 17, 20, 22-24, 28-29; pp. 375-396, 433-522, 613-656, 711-828, 931-1022.

(Continued)

*Primary Examiner*—Vu A Le
(74) *Attorney, Agent, or Firm*—Fletcher Yoder

(57) ABSTRACT

Methods for measuring the resistance of multiple memory elements are disclosed. The memory elements may be multi-bit memory and through precise measurement of resistance of the multi-bit memory elements, determination of how many and which memory elements fall into specific memory ranges can be accomplished. Furthermore, storage and/or display of this information may allow for the creation of resistance distribution histograms for modeling of one or more memory arrays.

17 Claims, 11 Drawing Sheets

U.S. PATENT DOCUMENTS

| | | | |
|---|---|---|---|
| 6,954,390 | B2 | 10/2005 | Baker |
| 6,954,391 | B2 | 10/2005 | Baker |
| 6,985,375 | B2 | 1/2006 | Baker |
| 7,002,833 | B2 | 2/2006 | Hush et al. |
| 7,009,901 | B2 | 3/2006 | Baker |
| 7,095,667 | B2 | 8/2006 | Baker |
| 7,102,932 | B2 | 9/2006 | Baker |
| 7,133,307 | B2 | 11/2006 | Baker |
| 2002/0101758 | A1 | 8/2002 | Baker |
| 2002/0194557 | A1 | 12/2002 | Park |
| 2003/0039162 | A1 | 2/2003 | Baker |
| 2003/0043616 | A1 | 3/2003 | Baker |
| 2003/0067797 | A1 | 4/2003 | Baker |
| 2003/0198078 | A1 | 10/2003 | Baker |
| 2003/0214868 | A1 | 11/2003 | Baker |
| 2004/0008555 | A1 | 1/2004 | Baker |
| 2004/0032760 | A1 | 2/2004 | Baker |
| 2004/0062100 | A1 | 4/2004 | Baker |
| 2004/0076052 | A1 | 4/2004 | Baker |
| 2004/0095839 | A1 | 5/2004 | Baker |
| 2004/0160351 | A1* | 8/2004 | Rossi .................. 341/161 |
| 2004/0190327 | A1 | 9/2004 | Baker |
| 2004/0190334 | A1 | 9/2004 | Baker |
| 2004/0199710 | A1 | 10/2004 | Baker |
| 2004/0240294 | A1 | 12/2004 | Baker |
| 2005/0002249 | A1 | 1/2005 | Baker |
| 2005/0007803 | A1 | 1/2005 | Baker |
| 2005/0007850 | A1 | 1/2005 | Baker |
| 2005/0013184 | A1 | 1/2005 | Baker |
| 2005/0018477 | A1 | 1/2005 | Baker |
| 2005/0018512 | A1* | 1/2005 | Baker .................. 365/209 |
| 2005/0041128 | A1 | 2/2005 | Baker |
| 2005/0088892 | A1 | 4/2005 | Baker |
| 2005/0088893 | A1 | 4/2005 | Baker |
| 2005/0201145 | A1 | 9/2005 | Baker |
| 2006/0013040 | A1 | 1/2006 | Baker |
| 2006/0062062 | A1 | 3/2006 | Baker |
| 2006/0227641 | A1 | 10/2006 | Baker |
| 2006/0250853 | A1 | 11/2006 | Taylor et al. |
| 2009/0323408 | A1* | 12/2009 | Taylor et al. ........... 365/163 |

OTHER PUBLICATIONS

Rane Corporation, RaneNote 137, "*Digital Dharma of Audio A/D Converters*," 1997, 12 pgs.

Baker, R.J., (2001-2006) *Sensing Circuits for Resistive Memory*, presented at various universities and companies.

Baker, "*CMOS Mixed Signal Circuit Design*," IEEE Press, A. John Wiley & Sons, Inc.; Copyright 2003, Figures 30.63, 31.82, 32.6, 32.7, 32.24, 32.51, 33.34, 33.47, 33.51, 34.18, 34.24; located at http://cmosedu.com/cmos2/book2.htm.

Dallas Semiconductor, Maxim Application Note 1870, "*Demystifying Sigma-Delta ADCs*," (Jan. 31, 2003), 15 pgs.

Baker, R.J., (2003) *Mixed-Signal Design in the Microelectronics Curriculum*, IEEE University/Government/Industry Microelectronics (UGIM) Symposium, Jun. 30-Jul. 2, 2003.

Baker, R.J. (2004) Delta-Sigma Modulation for Sensing, *IEEE/EDS Workshop on Microelectronics and Electron Devices (WMED)*, Apr. 2004.

Hadrick, M. and Baker, R.J., (2005) *Sensing in CMOS Imagers using Delta-Sigma Modulation*, a general presentation of our work in this area.

Baker, R.J. (2005) Design of High-Speed CMOS Op-Amps for Signal Processing, *IEEE/EDS Workshop on Microelectronics and Electron Devices (WMED)*, Apr. 2005.

Leslie, M.B., and Baker, R.J., (2006) "Noise-Shaping Sense Amplifier for MRAM Cross-Point Arrays," *IEEE Journal of Solid State Circuits*, vol. 41, No. 3, pp. 699-704.

Duvvada, K., Saxena, V., and Baker, R. J., (2006) *High Speed Digital Input Buffer Circuits*, proceedings of the IEEE/EDS Workshop on Microelectronics and Electron Devices (WMED), pp. 11-12, Apr. 2006.

Saxena, V., Plum, T.J., Jessing, J.R., and Baker, R. J., (2006) *Design and Fabrication of a MEMS Capacitive Chemical Sensor System*, proceedings of the IEEE/EDS Workshop on Microelectronics and Electron Devices (WMED), pp. 17-18, Apr. 2006.

Baker, R.J. and Saxena, V., (2007) *Design of Bandpass Delta Sigma Modulators: Avoiding Common Mistakes*, presented at various universities and companies.

Wikipedia—definition of "Error detection and correction", pulled from website Jun. 1, 2007, 9 pgs.

Wikipedia—definition of "Hamming code", pulled from website Jun. 1, 2007, 8 pgs.

Wikipedia—definition of "Linear feedback shift register (LFSR)," pulled from website Jun. 1, 2007, 4 pgs.

Park, "*Motorola Digital Signal Processors—Principles of Sigma-Delta Modulation for Analog-to-Digital Converters*,"(Undated), 2010.

* cited by examiner

US 7,864,609 B2

METHODS FOR DETERMINING RESISTANCE OF PHASE CHANGE MEMORY ELEMENTS

BACKGROUND

1. Field of the Invention

Embodiments of the invention relate generally to determining resistance levels in phase change memory.

2. Description of the Related Art

Demands for memory capacity continue to increase in modern electronic devices. At the same time, size of circuitry is at an increased premium as devices which utilize memory circuitry continue to shrink. One solution as to how to increase memory capacity while minimizing the amount of space occupied by memory circuitry has involved the development of memory elements that are capable of assuming more than two states. For example, some memory elements are capable of multi-bit (e.g., more than two state) storage. For instance, rather than outputting either a high or low voltage, the memory element may output four or eight different voltage levels, each level corresponding to a different data value.

One type of multi-bit storage memory is phase change memory. Phase change memory may store multi-bit data through resistance variations caused by phase changes of the material used in the manufacture of the memory. The state of the material of which the phase change memory is composed may be switched between amorphous, partially crystalline, and crystalline states with the application of external influences, for example, heat. The different states of the material each have distinct resistance properties that may be measured and associated with a data bit.

Conventional measuring techniques fail to adequately measure the differences in the resistance values of a phase change memory. This may lead to errors in the grouping of resistance values of a plurality of phase change memory elements into a distribution curve, typically used to show the number of memory elements programmed to each of a plurality of different states. Without proper valuation of the resistance distribution of a memory array of phase change memory elements, the individual memory elements may be programmed at resistance levels that overflow and corrupt data stored at other resistance levels. Alternatively, without proper valuation of the resistance distribution of a memory array, the difference between the levels (e.g., voltage) to be sensed may be set at levels larger than required, which tends to reduce memory density and increase the cost of memory. Thus, there is a need for measuring techniques that can accurately determine the resistance ranges for phase change memory.

DETAILED DESCRIPTION OF SPECIFIC EMBODIMENTS

Various embodiments of the present invention are described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming but would nevertheless be a routine undertaking of design, fabrication, and manufacture for those of ordinary skill having the benefit of this disclosure.

The present disclosure generally relates to measuring the resistance of multiple memory elements. The multiple memory elements may be phase change memory elements grouped together in an array. The memory elements may also be multi-bit memory, which may allow circuit designers to increase the number of bits stored per memory element. Through precise measurement of the resistance of the multi-bit memory elements in conjunction with the controlled charging and discharging of system capacitance, determination of how many and which memory elements fall into specific memory resistance ranges can be accomplished. Furthermore, storage and/or display of this information may allow for the creation of resistance distribution histograms for modeling of one or more memory arrays by graphically plotting the resistance values for memory elements during a set and a reset state (which may correspond to multiple storage levels for the memory elements).

Figure 1:
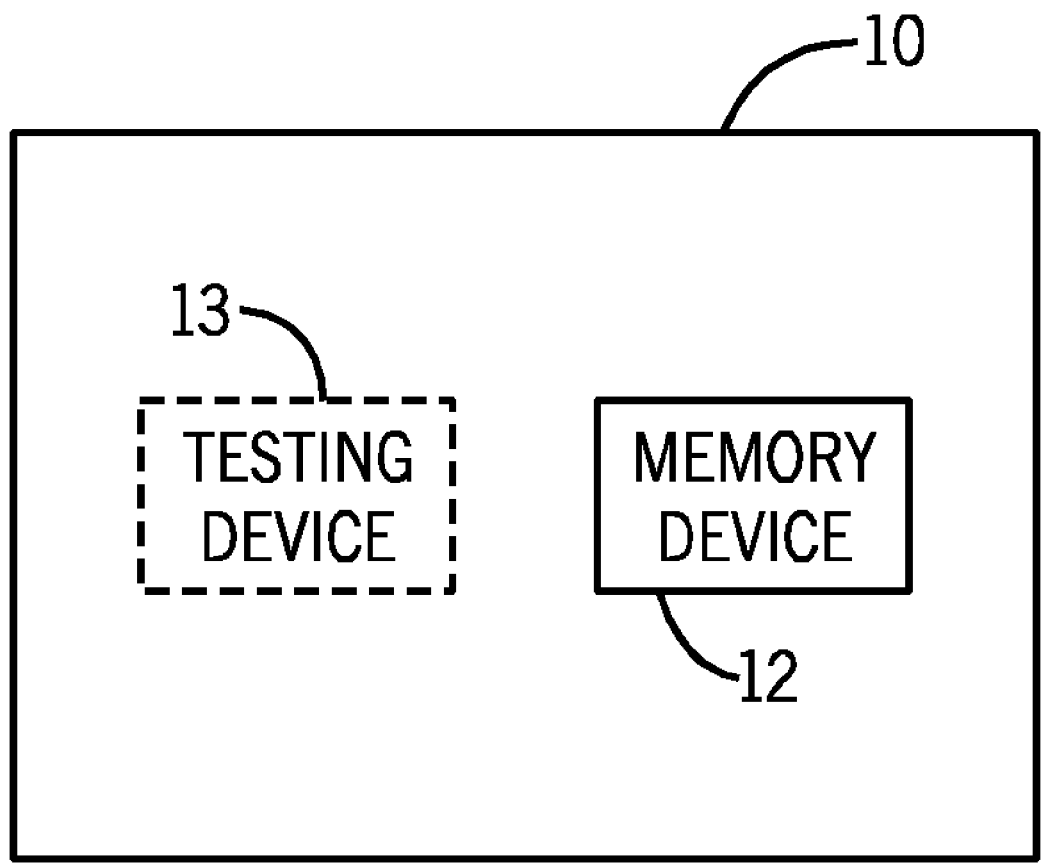
FIG. 1 illustrates an electronic device in accordance with an embodiment of the present invention.

FIG. 1 depicts an electronic device 10 that may be fabricated and configured in accordance with one or more of the present embodiments. The illustrated electronic device 10 includes a memory device 12 that, as explained further below, may include multi-bit memory elements and quantizing circuits. Alternatively, or additionally, the electronic device 10 may include a testing device 13 having the quantizing circuits included therein. Moreover, the testing device 13 may be internal to or external to the electronic device 10, as well as internal to or external to the memory device 12. Testing device 13 may be utilized in the determination of a resistance distribution, which may include the number of memory elements programmed to each of a plurality of different states for one or more memory arrays.

Figure 2:
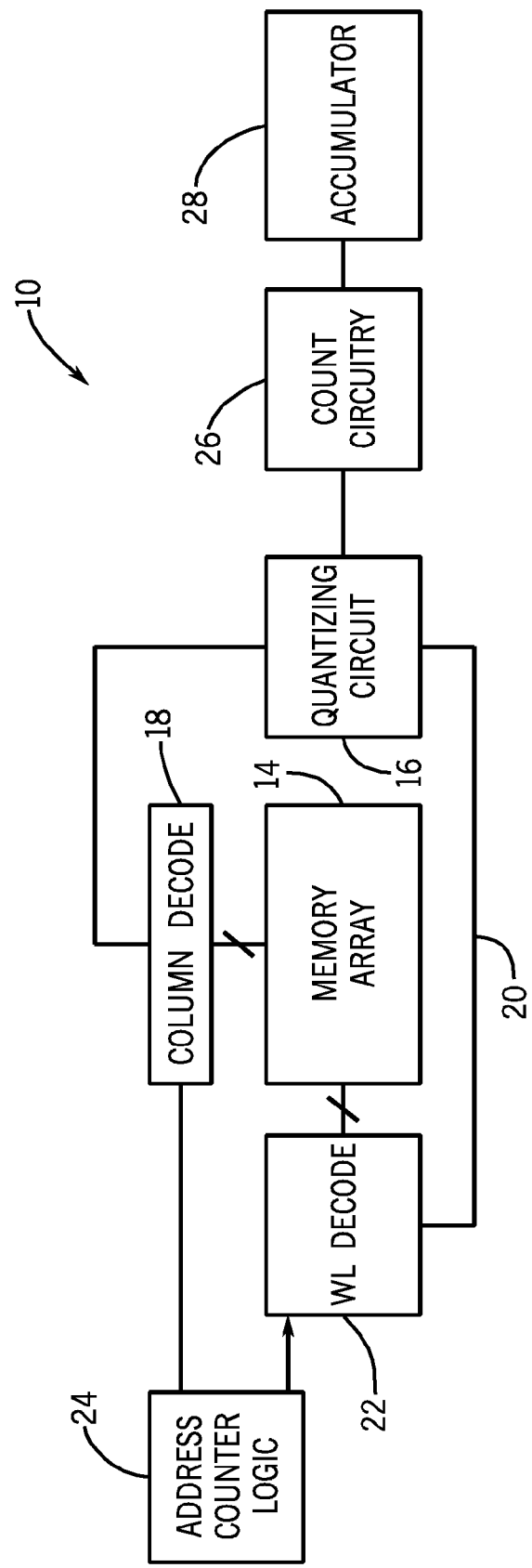
FIG. 2 illustrates a block diagram of the electronic device illustrated of FIG. 1.

FIG. 2 depicts a block diagram of an embodiment of the electronic device 10. The illustrated memory device 12 may include a memory array 14, a quantizing circuit 16, column decode circuitry 18, a word line enable path 20, word line decode circuitry 22, an address counter logic circuit 24, count circuitry 26, and an accumulator circuit 28. As described below with reference to FIG. 3, the memory array 14 may include a matrix of memory elements arranged in rows and columns. When accessing the memory elements of the memory array 14, the address counter logic circuit 24 may receive a command to read from or write to a target memory address. The address counter logic circuit 24 may convert the command designating a target address into a row and a column address. This command may be passed to the column decode circuitry 18 and the word line decode circuitry 22. The word line decode circuitry 22 may also receive a word line enable signal along the word line enable path 20. The word line enable signal acts to provide an activation signal allowing a read signal or a write signal to be transmitted to the memory array 14 along the row specified by the address counter logic circuit 24. Similarly, the column decoder 18 may determine which column of the memory array 14 corresponds with the column specified by the address counter logic circuit 24, and may pass the signal transmitted from the specified memory location to the quantizing circuit 16. The quantizing circuit 16 may sense an output voltage or current from the memory element at the specified row and column of the memory array 14.

The quantizing circuit 16 may sense multiple iterations of a voltage or current from the specified row and column of the memory array 14. Alternatively, the quantizing circuit 16 may sense one or more iterations of a voltage or current from multiple specified rows and columns of the memory array 14 one memory location at a time as a part of a step through testing process of the memory array 14. The output of the quantizing circuit 16 may be sent to the count circuitry 26, which may count pulses or high portions of a digital signal. The results of the counting performed in the count circuitry 26 may be transmitted to an accumulator 28, in which the results may be stored. These results may, for example, be used in the modeling of the memory array 14.

Figure 3:
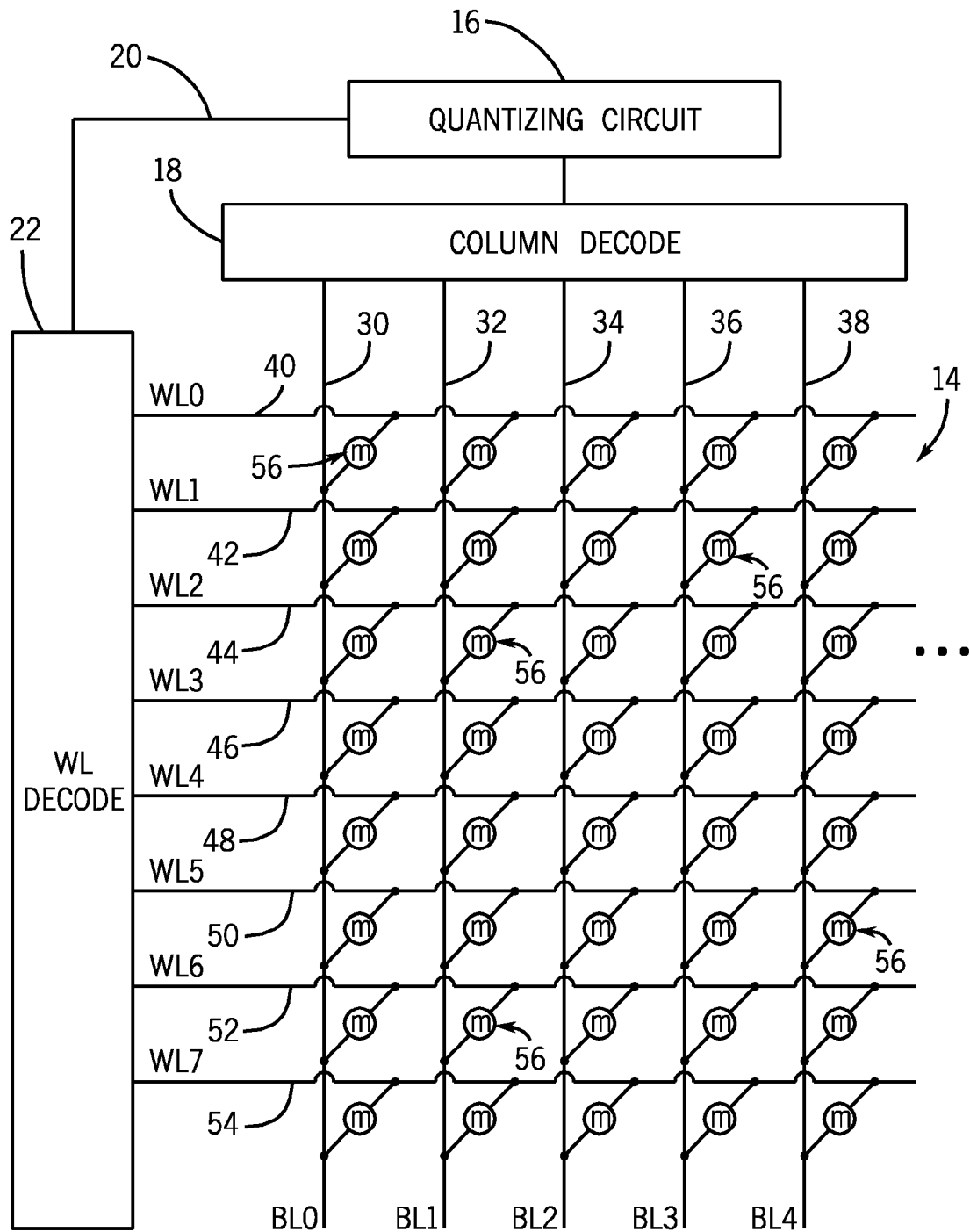
FIG. 3 illustrates a memory array of FIG. 2 in accordance with an embodiment of the present invention.

FIG. 3 depicts a memory array 14 that includes a plurality of data lines, such as bit lines 30, 32, 34, 36, and 38 (also referred to as BL0-BL4) and a plurality of access lines, such as word lines 40, 42, 44, 46, 48, 50, 52, and 54 (also referred to as WL0-WL7). These bit lines and word lines may be electrical conductors. The memory array 14 further may include a plurality of memory elements 56, each of which may be arranged to intersect one of the bit lines, e.g. BL1, and one of the word lines, e.g. WL2. Each of the plurality of memory elements 56 may be referred to generally as an internal data storage location, i.e., a device configured to convey data, either stored or generated by a sensor, when accessed by a sensing circuit, such as a quantizing circuit discussed below. These internal data storage locations may be formed on an integrated semiconductor device that also includes the other components of the memory device 12. In some embodiments, the illustrated memory elements 56 may include a resistance memory, such as a phase change memory or magnetoresistive memory. It should be noted that, in other embodiments, the memory elements 56 may include other types of volatile or nonvolatile memory.

The memory array 14 may be coupled to the quantizing circuit 16 via the column decode circuitry 18. The illustrated column decode circuitry 18 may be coupled to each of the bit lines 30, 32, 34, 36, and 38, respectively. The column decode circuitry 18 may determine which bit line is to be accessed and, subsequently, transmit signals from the accessed bit line to the quantizing circuit 16. In this manner, the quantizing circuit 16 may receive signals from all memory elements 56 of the memory array 14, which as will be described below, allows for the determination of the resistance values for any/all of the memory elements 56 of the memory array 14.

In operation, the quantizing circuit 16 may digitize analog signals from the memory elements 56 in a manner that is relatively robust to noise. As explained below, the quantizing circuit 16 may do this by converting the analog signals into a bit-stream and digitally filtering high-frequency components from the bit-stream. The quantizing circuit 16 may include a one-bit analog-to-digital converter or a multi-bit analog-to-digital converter. In the present embodiment, the quantizing circuit 16 receives an analog signal from any one of the plurality of memory elements 56, and may output a bit-stream that corresponds with the analog signal. The bit-stream may be a one-bit, serial signal that generally represents or corresponds to a discharge of voltage of either a parasitic or a discrete capacitance element of the quantizing circuit 16. That is, the bit-stream may fluctuate between values of zero and one, to form a pulse wave. The quantizing circuit 16 may transmit this bit-stream to the count circuitry 26. The count circuitry 26 may then be utilized to sum the pulses of the bit-stream over a given duration of time.

In traditional designs, the number of discrete data values that each of the memory elements 56 stores may be limited by sense amplifiers that react to noise. In contrast, the quantizing circuit 16 may be less susceptible to noise, and, as a result, the memory elements 56 may be configured to store additional data. Without the high frequency noise, the intervals between signals representative of different data values may be made smaller, and the number of data values stored by a given memory element 56 may be increased. Thus, beneficially, the quantizing circuit 16 may sense memory elements 56 that store several bits of data, e.g., 2, 3, 4, 5, 6, 7, 8, or more bits per each one of the memory elements 56. Each one of a plurality of memory arrays 14 may be coupled to a discrete quantizing circuit 16, column decode circuitry 18, and word line decode circuitry 22.

Figure 4A:
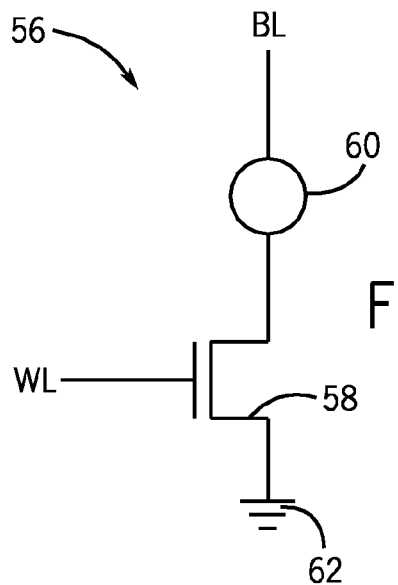
FIG. 4A illustrates a first memory element of FIG. 3 in accordance with an embodiment of the present invention.
Figure 4B:
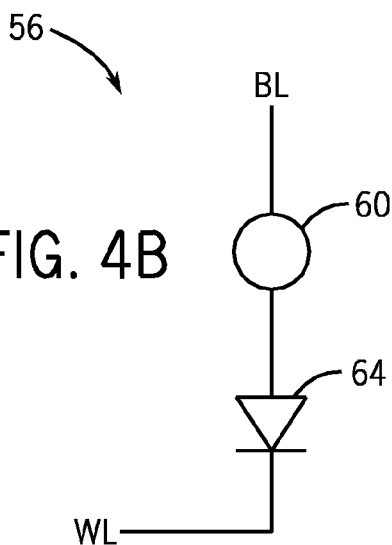
FIG. 4B illustrates a second memory element of FIG. 3 in accordance with an embodiment of the present invention.
Figure 4C:
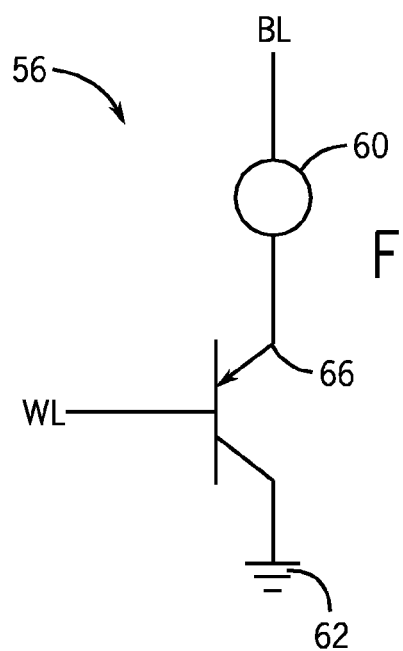
FIG. 4C illustrates a third memory element of FIG. 3 in accordance with an embodiment of the present invention.

Advantageously, in certain embodiments, the quantizing circuit 16 may facilitate the use of multi-bit memory elements 56. FIGS. 4A-C illustrate three distinct embodiments for each of the memory elements 56. It should be noted that while three embodiments are shown, typically only one embodiment will be utilized throughout any given memory array 14. FIG. 4A illustrates a N-type metal oxide semiconductor field effect transistor (NMOS) 58, a phase change memory cell 60 and ground 62. The NMOS 58 may act as a switch, operating in an "on" mode when voltage is applied along the word line to the gate of the NMOS 58 (thus allowing current to flow through the NMOS 58). Similarly, the NMOS may operate in an "off" mode when no voltage is applied along the word line to the gate of the NMOS 58 (thus restricting current to flow through the NMOS 58). When the NMOS 58 is in "on" mode, current may pass from the bit line to the phase change memory cell 60. This flow of current through the memory cell 60 will allow for testing of the resistance of the memory cell 60, as will be described subsequently.

FIGS. 4B and 4C illustrate second and third embodiments of the memory elements 56. FIG. 4B illustrates a diode 64 in series with the memory cell 60, while FIG. 4C illustrates a bipolar junction transistor (BJT) 66 in series with memory cell 60. In both FIGS. 4B and 4C, the word line enable signal is used to activate flow of current through the specified memory cell 60. This word line enable signal is an active low enabling signal in conjunction with both the diode 64 and the BJT 66. That is, when the word line enable signal is high, both the diode 64 and the BJT 66 operate in the "off" mode, preventing current from passing through the memory cell 60.

Conversely, when the word line enable signal is low, both the diode 64 and the BJT 66 operate in the "on" mode, thus allowing current to pass from the bit line to the memory cell 60. This bit line may coupled to the quantizing circuit 16 to allow for testing of the resistance of the memory cell 60.

Figure 5:
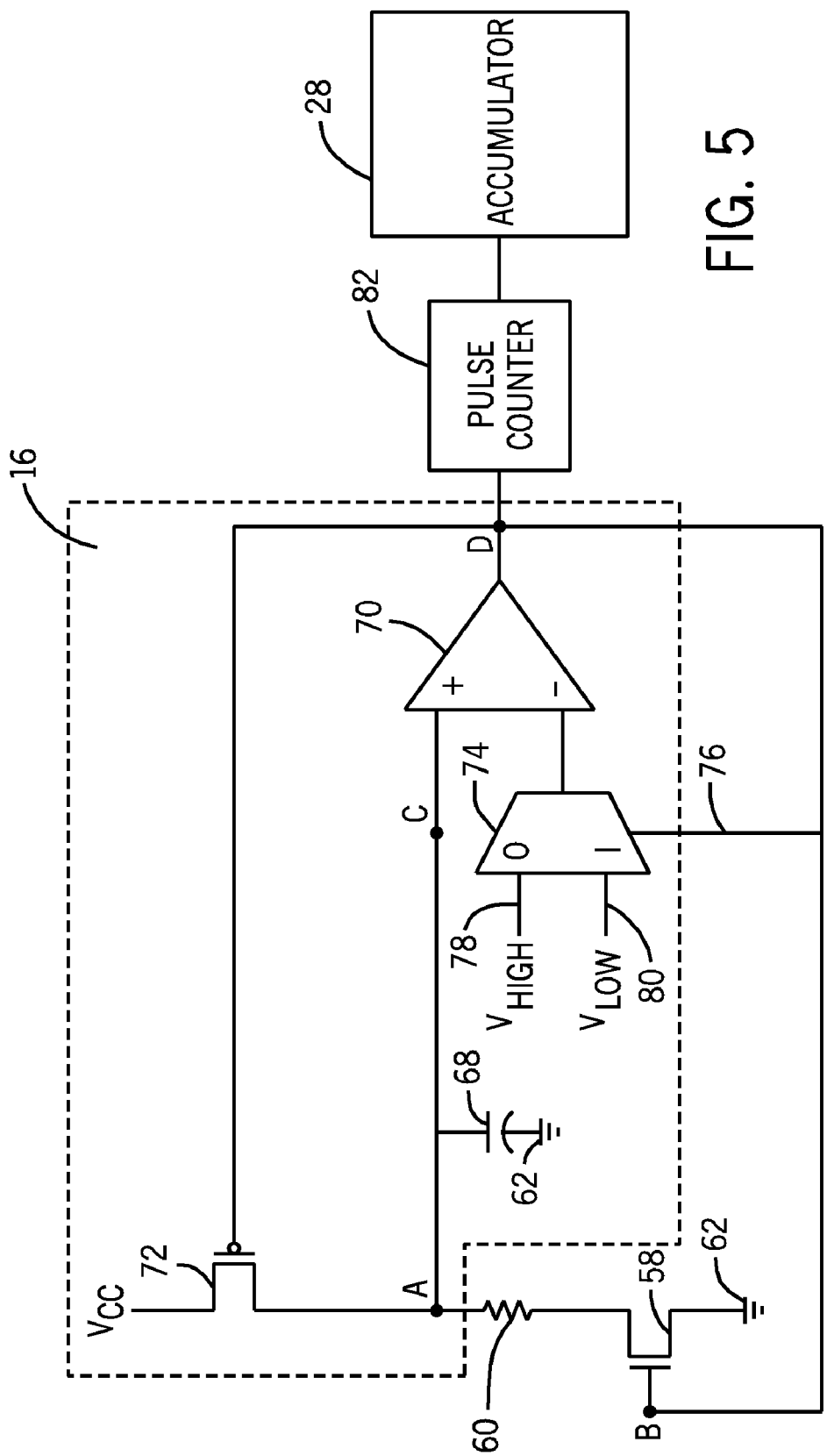
FIG. 5 illustrates a first quantizing circuit in accordance with an embodiment of the present invention.

FIG. 5 illustrates a quantizing circuit 16, as described above. The quantizing circuit 16 is illustrated as coupled to a memory cell 60 (modeled as a resistor 60) from memory array 14, as well as a pulse counter 82. While the memory cell 60 is shown in conjunction with the NMOS 58 to form a memory element 56, a diode 64 or a BJT 66 could also be implemented for use with memory cell 60 instead of NMOS 58 to form memory element 56. Furthermore, it should be noted that while column decode circuitry is not illustrated, it may be implemented at point A of FIG. 5. Similarly, word line decode circuitry is not illustrated, however, it may be implemented at point B of FIG. 5.

The quantizing circuit 16 may include a capacitance 68. This capacitance 68 may be the parasitic line capacitance of the quantizing circuit 16 and/or the capacitance 68 may be a discrete component included in the quantizing circuit 16. The quantizing circuit may also include an operational amplifier (op-amp) 70 and a p-type metal-oxide-semiconductor (PMOS) 72. The PMOS 72 will be shown to operate as a pull up device in conjunction with the NMOS 58, which operates as a pull down device, to control charging/discharging of the capacitance 68 via a two-way multiplexer (mux) 74. The mux 74 allows for the selection of two reference voltages, $V_{HIGH}$ 78 and $V_{LOW}$ 80. The reference voltages $V_{HIGH}$ 78 and $V_{LOW}$ 80 may provide necessary hysteresis for the measurement of the resistance of the memory cell 60, and may be selected so as to prevent an inadvertent corruption of the memory cell 60. In this configuration, the op-amp 70 operates as a comparator. Thus configured, the quantizing circuit 16 may allow for measurement of the resistance of a memory cell 60 by performing an analog to digital conversion of the RC discharging time, which will be described more fully below. This measurement may be then be monitored by the pulse counter 82.

The pulse counter 82 output can be used to determine the resistance of the memory cell 60 tested by the circuitry outlined in FIG. 5. The capacitance 68 charging time is dependent only on its capacitance value and the supplied current, according to the formula for capacitance charging time, $dt=C/I*dV$, where dt is the derivative of time, C is the capacitance 68, I is the current flowing through a capacitance element, and dV is the derivative of voltage. Furthermore, the discharging time of the capacitance 68 is dependent upon the resistance of the memory cell 60, according to the voltage discharge equation $V_{LOW}=V_{HIGH} e^{(-t/RC)}$, where t is time, R is the resistance of the memory cell 60, C is the capacitance 68, and $V_{HIGH}$ 78 and $V_{LOW}$ 80 are the reference voltages that determine the swing of the voltage of the capacitance 68. The values for $V_{HIGH}$ 78 and $V_{LOW}$ 80 can be chosen to set hysteresis for the system so that the voltage does not disturb the functioning of the memory cell 60, but provides adequate swing of the voltage of the capacitance 68. This will allow for a reasonable period for measuring the output of the memory cell 60, for example, 100 μs. Solving for this period may be accomplished through taking the natural log of the voltage discharge equation, yielding $t=-RC*\ln(V_{LOW}/V_{HIGH})$.

As shown above, the output of the op-amp 70 is directly coupled to the pulse counter 82. The output of the pulse counter 82 can then be related to the memory cell resistance by $N=T/(t_D+t_C)$, where N is the pulse counter 82 output, T is total sensing time, $t_D$ is the discharge time, which can be found from $-RC*\ln(V_{LOW}/V_{HIGH})$, and $t_C$ is the charging time, which can be found from $C/I*(V_{HIGH}-V_{LOW})$. Substituting for $t_D$ yields $N=T/[t_C-RC*\ln(V_{LOW}/V_{HIGH})]$. By further substituting a for $t_C/C*\ln(V_{LOW}/V_{HIGH})$, and β for $T/[C*\ln(V_{LOW}/V_{HIGH})]$, the resistance of memory cell 60 can be represented as $R=\alpha-\beta/N$. Therefore, the memory cell 60 resistance is proportional to $-1/N$. As such, the resistance of any given memory cell 60 is proportional to the inverse of the pulse counter 82 output. Furthermore, if memory cell 60 is a phase change memory type, the testing procedure may be repeated for different data states. Accordingly, the resistance of the memory cell 60 may be measured for these different data states to determine the resistance of the memory cell 60 with respect to differing external influences.

Figure 6:
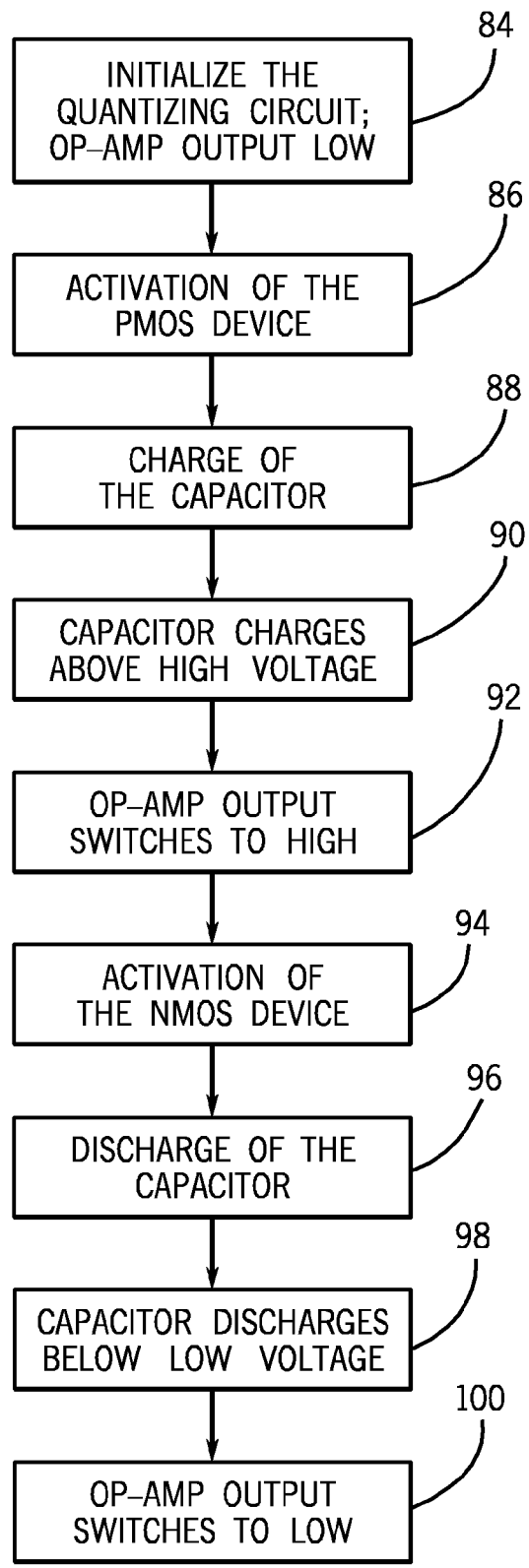
FIG. 6 is a flow chart illustrating the operation of the first quantizing circuit of FIG. 5.
Figure 7:
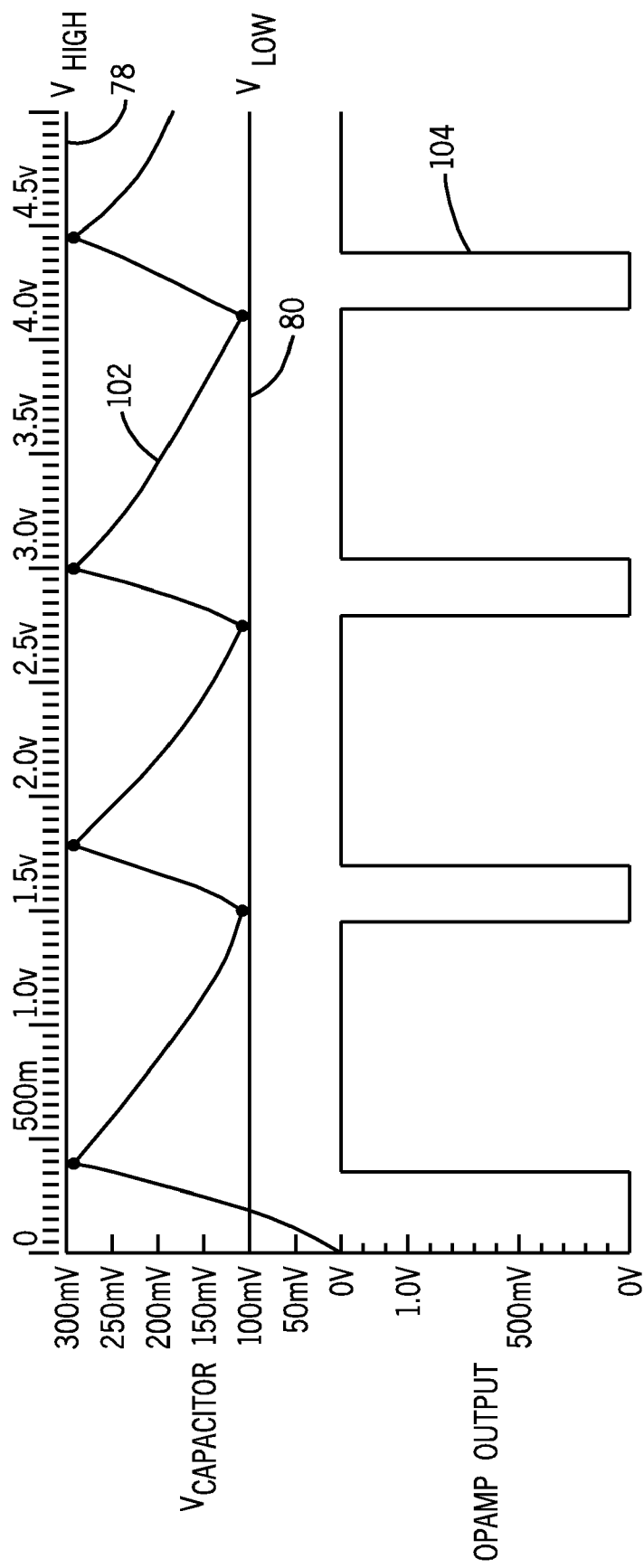
FIG. 7 is a graph representing the outputs of the first quantizing circuit of FIG. 5.

The operation of the quantizing circuit 16, as described in FIG. 5, is illustrated with respect to FIG. 6. FIG. 6 illustrates a method of taking a resistance measurement of the memory cell 60. In step 84, the quantizing circuit 16 is initialized by pre-charging the capacitance 68 to ground, while selecting the reference voltage $V_{HIGH}$ 78 by the mux 74. The result of this initialization step 84 is that the output of the op-amp 70 is low. This activates the PMOS 72 in step 86. The activation of the PMOS 72 provides a charging path for the capacitance 68. The capacitance 68 continues to charge in step 88 until the capacitance 68 is charged to a voltage above the reference voltage $V_{HIGH}$ 78 in step 90. When this occurs, the op-amp 70 output switches to high in step 92, causing the reference voltage $V_{LOW}$ 80 to be selected by the mux 74. This causes the deactivation of the PMOS 72, as well as the activation of the NMOS 58 in step 94. The activation of the NMOS 58 provides a discharging path for the capacitance 68 through the memory cell 60 in step 96. In step 98, the capacitance 68 will continue to discharge to a voltage lower than the reference voltage $V_{LOW}$ 80, causing the op-amp 70 output to switch to low in step 100. This begins the charging cycle anew in step 86. FIG. 7 shows a graphical representation of the process outlined above with respect to FIG. 6.

Figure 8:
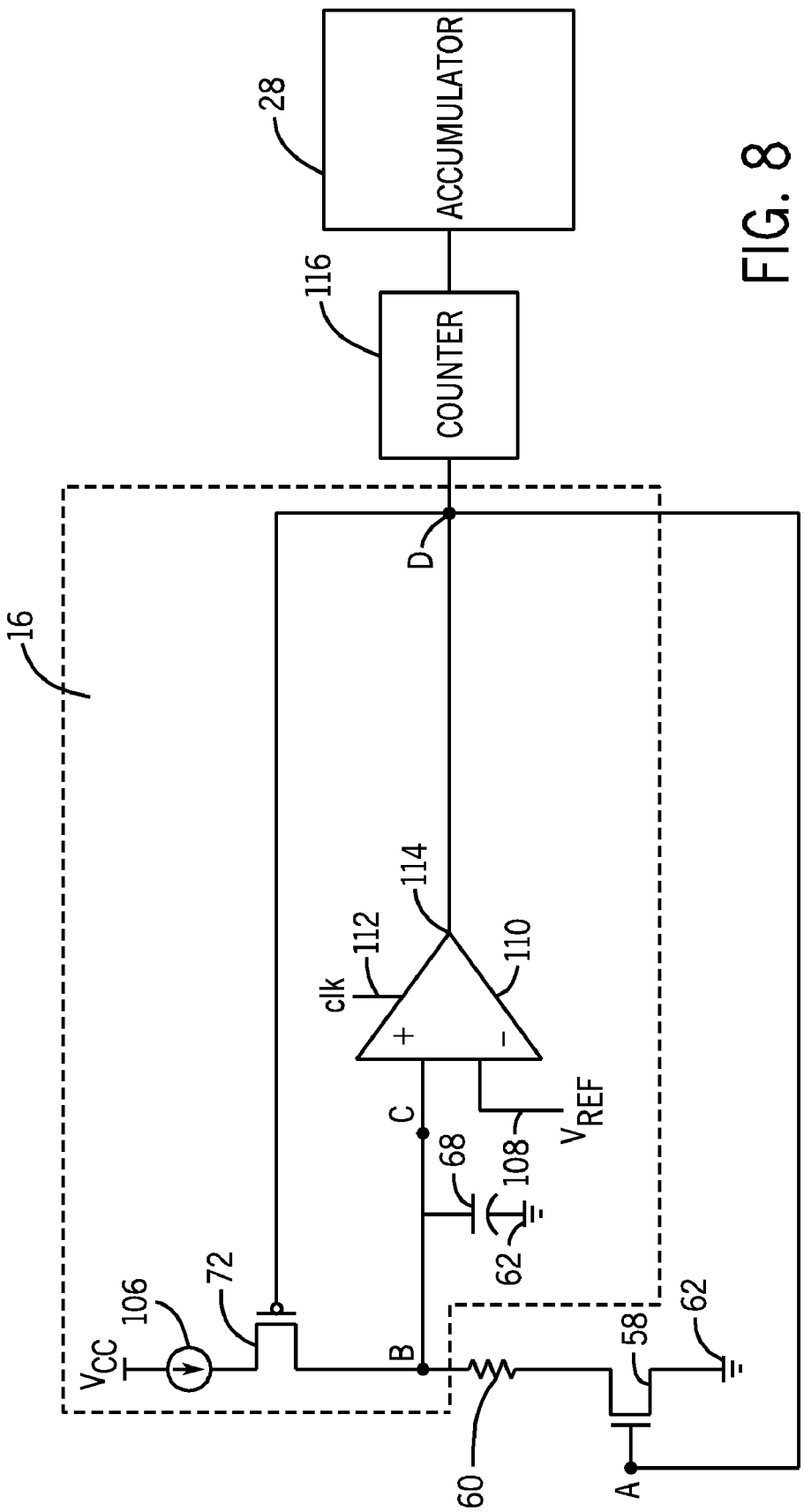
FIG. 8 illustrates a second quantizing circuit in accordance with an second embodiment of the present invention.

As can be seen in FIG. 7, the voltage level of the capacitance 68 over time at point C of FIG. 5 is illustrated by the graph 102 representing the voltage of the capacitance 68. Furthermore, the voltage level of the op-amp 70 output over time at point D of FIG. 5 is illustrated by the graph 104 representing op-amp 70 output. As can be seen in FIG. 8, the quantizing circuit 16 effectively translates an analog signal 102 into a digital signal 104 that can be counted by pulse counter 82.

The results of these measurements may be transmitted as pulses from the pulse counter 82 to, for example, an accumulator 28 for logging of the data. The accumulator 28 may store the data for subsequent processing, or the accumulator 28 may determine the distribution of the resistance levels of the memory elements 56 of the memory array 14 such that the resistance levels of for every memory element 56 can be characterized for later use in the storage of data. Alternatively, the accumulator 28 may store data relating to the total number of memory elements 56 that fall into specific resistance ranges.

FIG. 8 illustrates a second embodiment for the quantizing circuit 16. As with FIG. 5 above, the phase change memory cell 60 in FIG. 8 incorporates the NMOS 58, however, as described above, a diode 64 or a BJT 66 could be implemented in place of the NMOS 58. Moreover, although column decode circuitry and word line enable circuitry are not illustrated, they may be implemented at points A and B of FIG. 8, respectively.

The quantizing circuit 16 may include a current source 106, a PMOS 72, a capacitance 68, and a clocked comparator 110. The clocked comparator 110 may include an op-amp, inverters, and clocked inverters arranged in such a manner as to maintain an average voltage equal to a reference voltage $V_{REF}$ 108 across the capacitance 68. The clocked comparator 110 may accomplish maintaining this average voltage by alternatingly supplying a charging path to the capacitance 68 from the current source 106 and supplying a discharge path for the capacitance 68 through the memory cell 60 to ground 62. The clocked comparator 110 may be activated by a clock signal that is transmitted via clock line 112 to control the timing of the clocked comparator 110 in generating an output on output line 114.

Since the feedback controlling the current source 106 and memory cell 60 is clocked via clock line 112, the capacitance 68 may be charged and discharged for time periods at multiples of the clock cycle. As such, the clock frequency may be selected such that the capacitance 68 will not fully discharge through the minimum expected memory resistance within one clock cycle. For example, for a minimum detectable resistance of 2KΩ and a capacitance of 10 pF, a clock period equal to the RC time constant of 20 ns might be selected. The output of the clocked comparator 110 may then be sent via output line 114 to a counter 116, and subsequently to an accumulator 28.

Figure 9:
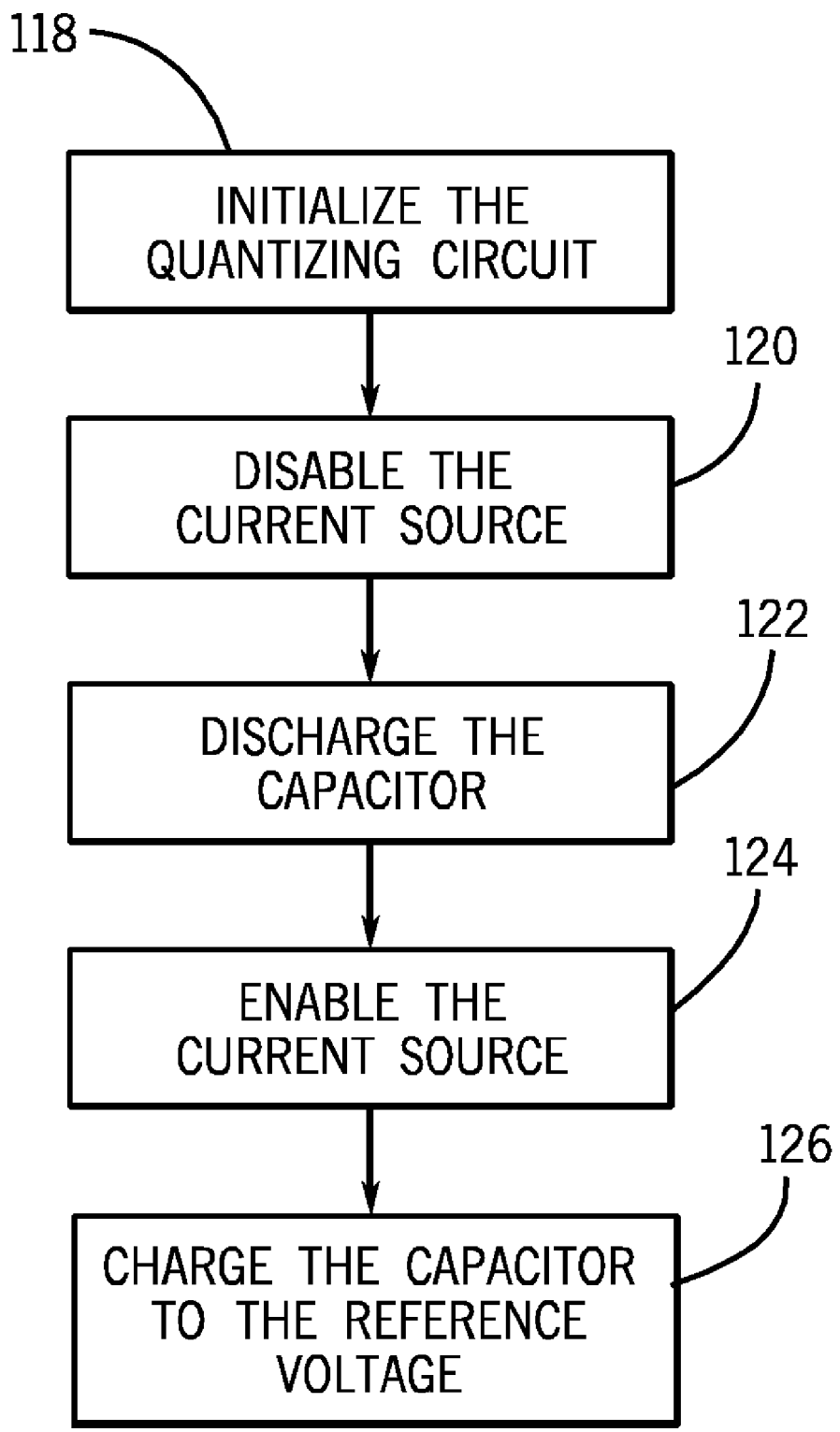
FIG. 9 is a flow chart illustrating the operation of the second quantizing circuit of FIG. 8.

The operation of the quantizing circuit 16, as described in FIG. 8, is illustrated with respect to FIG. 9. FIG. 9 illustrates a method of taking a resistance measurement of the memory cell 60. In step 118, the quantizing circuit 16 is initialized by pre-charging the capacitance 68 to a level above the reference voltage $V_{REF}$ 108. The result of this initialization step 118 is that the output of the clocked comparator 114 is active high, which enables the memory cell 60 and disables the current source 106 in step 120. Also in step 120, the NMOS 58 is activated. The activation of the NMOS 58 provides a discharging path for the capacitance 68. The capacitance 68 discharges through the memory cell 60 in step 122 for at least one clock cycle, until the switching point is reached. In step 124, after at least one clock cycle, the output of the clocked comparator 114 switches to active low which disables the memory cell 60 and enables the current source 106 as well as the PMOS 72. The activation of the PMOS 72 provides a charging path for the capacitance 68. This allows the current source 106 to charge the capacitance 68 in step 126 for the number of clock cycles required to bring the capacitance 68 voltage back up to the reference voltage $V_{REF}$ 108.

Figure 10:
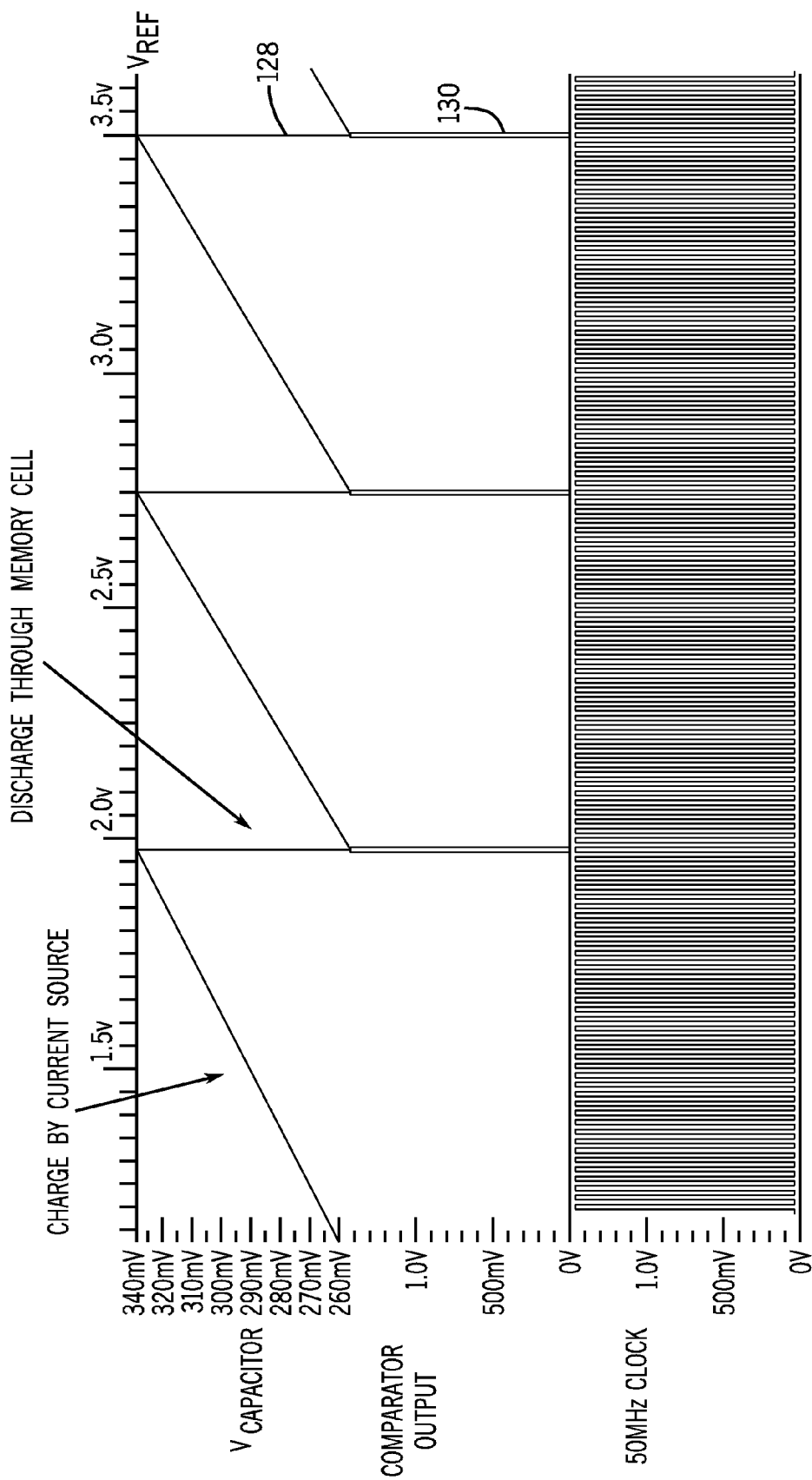
FIG. 10 is a graph representing the outputs of the second quantizing circuit of FIG. 8.

As can be seen in FIG. 10, the voltage level of the capacitance 68 over time at point C of FIG. 9 is illustrated by the graph 128 representing the voltage across the capacitance 68. Furthermore, the voltage level of the clocked comparator 114 over time at point D of FIG. 8 is illustrated by the graph 130 representing the op-amp 70 output. As can be seen in FIG. 10, the quantizing circuit 16 effectively translates an analog signal 128 into a digital signal 130 that can be counted by counter 116.

The counter 116 output can be used to determine the resistance of the memory cell 60 tested by the process outlined in FIG. 9. Since the capacitance 68 is connected to the memory cell 60 to form a simple RC network during each discharge cycle, the amount of charge lost is related to the memory cell resistance by $Q_{discharge}=C*dV$, where $dV=V_{ref}-V_{final}$. Moreover, $V_{final}=V_{ref}\hat{\ }(-t/RC)$, where t=comparator output high time. Since the clocked comparator 114 may be set to maintain a constant voltage across the capacitance, the amount of charge lost through the memory cell 60 during discharge will be equal to the amount of charge added to the capacitance 68 by the current source 106, so that $Q_{discharge}=Q_{charge}=I_{source}*$comparator output low time. Thus, the resistance of the memory cell 60 is related to the ratio of comparator 68 high time to low time. For example, for smaller resistance values, larger voltage drops will occur during one clock period, and longer re-charging times are required. These will be noted in the form of a digital signal that may be sent to the counter 116.

As shown above, the clocked comparator 114 output may be routed to the counter 116 to record the number of high (or low) comparator outputs. In one embodiment, the counter 116 output can be routed to a digital display to show the measured resistance at the end of each sensing period. In another embodiment, multiple outputs from the counter 116 can be stored in the accumulator 28 before being transmitted to a digital display. Additionally, the counter 116 outputs may be routed to the accumulator 28 to maintain a record of how many memory elements 56 fall into specific resistance ranges.

Furthermore, if the memory elements 56 include phase change memory, the memory cell 60 may undergo multiple phase changes as part of this testing procedure. The resistance of the memory cell 60 may be measured during each of these phase changes to determine the resistance of the memory cell 60 with respect to differing external influences. The results of these measurements may be transmitted as a digital signal from the counter 116 to the accumulator 28. In another embodiment, the accumulator 28 may determine the distribution of the resistance levels of the memory elements 56 so that the resistance levels of the memory elements 56 can be characterized for later use in storage of data. In another embodiment, the output of the counter 116 may be transmitted to the accumulator 28 to maintain a record of how many memory cells 60 fall into specific resistance ranges. These ranges may then be grouped to form resistance distribution histograms.

Figure 11:
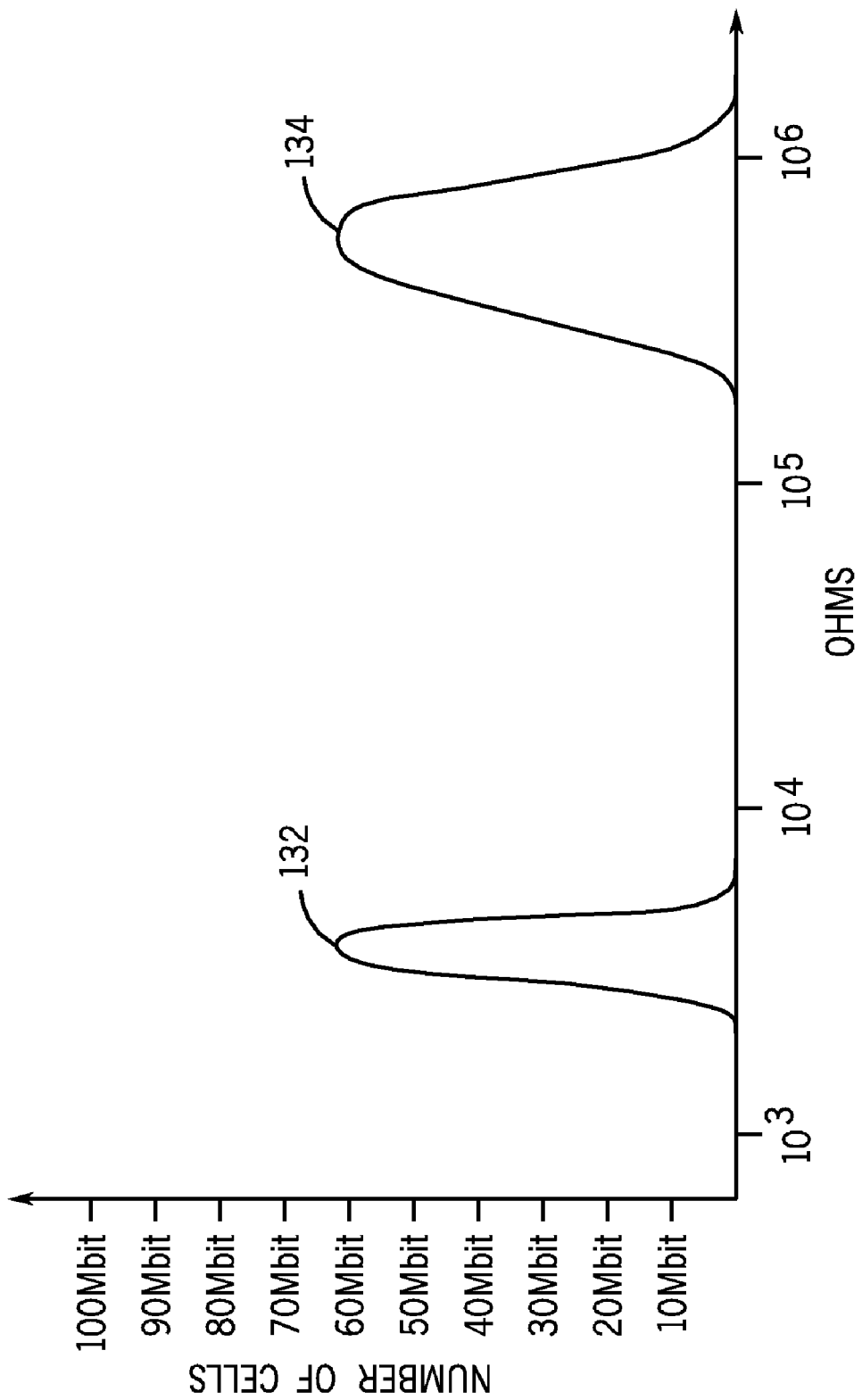
FIG. 11 is an example of a memory histogram representing the entire set of outputs of the second quantizing circuit associated with FIG. 8.

An example of a resistance distribution histogram is illustrated in FIG. 11. The resistance distribution histogram includes two resistance distributions, 132 and 134. The first resistance distribution 132 is associated with the set state, i.e. a low resistance state of the multi-state memory cells 60. The range that the memory cells 60 fall into for the set state typically follows a bell curve shape. In FIG. 11, the range that the memory cells 60 fall into for a set state is a bell curve centered around 6000 ohms, with the smallest values equaling about 4000 ohms and the largest values equaling about 8000 ohms. Similarly, the resistance distribution 134 representing the reset state, i.e. a high resistance state of the multi-state memory cells 60, also typically a follows a bell curve shape. The resistance distribution 134 shows that the bell shaped curve for the reset state of the memory cells 60 is centered around 800 Kohms, with the smallest values equaling about 300 Kohms and the largest values equaling about 1.3 Kohms. By analysis of these resistance distributions, the number of memory cells that fall into specific resistance ranges may be determined.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method for testing a memory device comprising:
   selecting a memory element coupleable to a quantizing circuit;
   initializing the quantizing circuit;
   activating the quantizing circuit, wherein activating the quantizing circuit activates a pull up device to allow voltage to charge a capacitance coupled to the memory element and to an op amp, wherein an output of the op amp switches to active high when a voltage across the capacitance exceeds a HIGH voltage supplied to the op amp; and monitoring an output of the quantizing circuit.

2. A method for testing a memory device comprising:
selecting a memory element coupleable to a quantizing circuit;
initializing the quantizing circuit, wherein initializing the quantizing circuit comprises:
    pre-charging a capacitance coupled between the memory element and an op amp; and
    setting a multiplexer coupled to the op amp to active high;
activating the quantizing circuit; and
monitoring an output of the quantizing circuit.

3. The method of claim 2, wherein initializing the quantizing circuit drives an output of the op amp to active low and activates a pull up device coupled to the op-amp.

4. A method for testing a memory device comprising:
selecting a memory element coupleable to a quantizing circuit;
initializing the quantizing circuit;
activating the quantizing circuit;
monitoring an output of the quantizing circuit; and
activating a pull down device, wherein activating the pull down device provides a path for a capacitance coupled to a memory element and an op amp to discharge a stored voltage, and wherein discharge of the stored voltage causes an output of the op amp to be active low when the stored voltage across the capacitance falls below a LOW voltage supplied to the op amp.

5. The method of claim 4, comprising activating a pull up device and deactivating the pull down device, wherein activating the pull up device provides a path for charging the capacitance coupled to a memory element and an op amp, and wherein charging the capacitance causes the output of the op amp to be active high when the stored voltage across the capacitance exceeds a HIGH voltage supplied to the op amp.

6. The method of claim 1, wherein monitoring the output of the quantizing circuit includes monitoring switches of an op amp output in the quantizing circuit from active low to active high.

7. The method of claim 6, further comprising determining a number of switches of the op amp output in the quantizing circuit from active low to active high.

8. The method of claim 7, comprising storing the monitored output of the quantizing circuit by transferring the determined number of switches of the op amp output in the quantizing circuit from active low to active high from the pulse counter to a storage device.

9. The method of claim 8, comprising determining a resistance of the memory element based on the determined number of switches of the op amp output in the quantizing circuit from active low to active high.

10. A method for testing a memory device comprising:
selecting a memory element coupleable to a quantizing circuit;
initializing the quantizing circuit, wherein initializing the quantizing circuit comprises pre-charging a capacitance coupled to the memory element and to a clocked comparator to a reference voltage;
activating the quantizing circuit; and
monitoring an output of the quantizing circuit.

11. The method of claim 10, wherein initializing the quantizing circuit drives an output of the clocked comparator to active high to disable a pull up device coupled to the clocked comparator.

12. The method of claim 10, wherein activating the quantizing circuit activates a pull down device to provide a path for the capacitance to discharge through the memory element.

13. The method of claim 12, wherein the discharge through the memory circuit occurs for at least one clock cycle of the clocked comparator.

14. The method of claim 13, wherein an output of the clocked comparator switches to active low after at least one clock cycle to enable a pull up device coupled to the clocked comparator.

15. The method of claim 1, wherein monitoring the output of the quantizing circuit includes determining a number of switches of an output of a clocked comparator in the quantizing circuit from active low to active high.

16. The method of claim 15, comprising storing the determined number of switches of the output of the clocked comparator in the quantizing circuit from active low to active high from in a storage device.

17. The method of claim 16, comprising determining a resistance of the memory element based on the stored number of switches of the output of the clocked comparator.

* * * * *